United States Patent
Co (10) Patent No.: US 7,389,381 B1
(45) Date of Patent: Jun. 17, 2008

(54) BRANCHING MEMORY-BUS MODULE WITH MULTIPLE DOWNLINK PORTS TO STANDARD FULLY-BUFFERED MEMORY MODULES

(76) Inventor: Ramon S. Co, 19326 Sleeping Oak Dr., Trabuco Canyon, CA (US) 92679

( * ) Notice: Subject to any disclaimer, the term of this patent is extended or adjusted under 35 U.S.C. 154(b) by 255 days.

(21) Appl. No.: 11/308,545

(22) Filed: Apr. 5, 2006

(51) Int. Cl.
 *G06F 13/28* (2006.01)
(52) U.S. Cl. ........................... 711/115; 711/154
(58) Field of Classification Search ............... 711/115, 711/154, 5; 710/22, 300, 305
See application file for complete search history.

(56) References Cited

U.S. PATENT DOCUMENTS

| | | | |
|---|---|---|---|
| 6,240,101 B1 | 5/2001 | Co et al. ................... 370/461 |
| 6,317,352 B1 | 11/2001 | Halbert et al. ............. 365/52 |
| 6,493,250 B2 | 12/2002 | Halbert et al. ............. 365/63 |
| 6,553,450 B1 | 4/2003 | Dodd et al. ................ 711/105 |
| 6,625,687 B1 | 9/2003 | Halbert et al. ............. 711/105 |
| 7,197,676 B2 * | 3/2007 | Co et al. ................... 714/718 |
| 2002/0101755 A1 | 8/2002 | Funaba et al. ............. 365/63 |
| 2002/0159284 A1 | 10/2002 | Funaba et al. ............. 365/63 |
| 2004/0105292 A1 | 6/2004 | Matsui ........................ 365/63 |
| 2004/0256638 A1 | 12/2004 | Perego et al. .............. 257/200 |
| 2005/0007805 A1 | 1/2005 | Ware et al. ................. 365/63 |
| 2005/0010737 A1 | 1/2005 | Ware et al. ................. 711/167 |
| 2005/0060600 A1 | 3/2005 | Jeddeloh ..................... 714/5 |

\* cited by examiner

*Primary Examiner*—Vu A Le
(74) *Attorney, Agent, or Firm*—gPatent LLC; Stuart T. Auvinen (57) ABSTRACT

A branching memory-bus module has one uplink port and two or more downlink ports. Frames sent downstream by a host processor are received on the uplink port and repeated to the multiple downlink ports to two or more branches of memory modules. Frames sent upstream to the processor by a memory module on a downlink port are repeated to the uplink port. A branching Advanced Memory Buffer (AMB) on the branching memory-bus module has re-timing and re-synchronizing buffers that repeat frames to the multiple downlink ports. Elastic buffers can merge and synchronize frames from different downlink branches. Separate northbound and southbound lanes may be replaced by bidirectional lanes to reduce pin counts. Latency from the host processor to the farthest memory module is reduced by branching compared with a serial daisy-chain of fully-buffered memory modules. Point-to-point bus segments have only two endpoints despite branching by the branching AMB.

20 Claims, 10 Drawing Sheets

FRONT SIDE　　PRIOR ART

PRIOR ART

PRIOR ART

BRANCHING MEMORY-BUS MODULE WITH MULTIPLE DOWNLINK PORTS TO STANDARD FULLY-BUFFERED MEMORY MODULES

RELATED APPLICATION

This application is related to the co-pending application for "Branching Fully-Buffered Memory-Module with Two Downlink and One Uplink Ports", U.S. Ser. No. 11/306,481, filed Dec. 29, 2005.

FIELD OF THE INVENTION

This invention relates to memory systems, and more particularly to branching fully-buffered modules.

BACKGROUND OF THE INVENTION

Personal computers (PC's) and other systems often use small printed-circuit board (PCB) daughter cards known as memory modules instead of directly mounting individual memory chips on a motherboard. The memory modules are constructed to meet specifications set by industry-standard groups, thus ensuring a wide potential market. High-volume production and competition have driven module costs down dramatically, benefiting the electronics buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The memory modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

Figure 1:
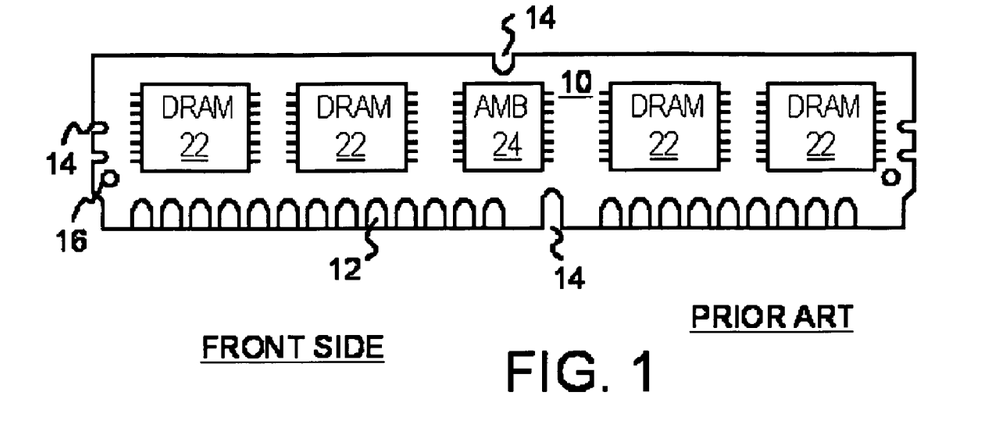
FIG. 1 shows a fully-buffered memory module.

FIG. 1 shows a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 is a fully-buffered dual-inline memory module (FB-DIMM) that is fully buffered by Advanced Memory Buffer (AMB) 24 on memory module 10.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

As system clock speeds increase, data must be transmitted and received at ever-increasing rates. Differential signaling techniques are being used to carry data, clock, and commands to and from memory modules. AMB 24 is a chip mounted onto the substrate of memory module 10 to support differential signaling through metal contact pads 12. AMB 24 sends and receives external packets or frames of data and commands to other memory modules in other sockets over differential data lines in metal contact pads 12.

AMB 24 also extracts data from the external frames and writes the extracted data to DRAM chips 22 on memory module 10. Command frames to read data are decoded by AMB 24. AMB 24 sends addresses and read signals to DRAM chips 22 to read the requested data, and packages the data into external frames that are transmitted from AMB 24 over metal contact pads 12 to other memory modules in a serial daisy chain and eventually to the host processor.

Memory module 10 is known as a fully-buffered memory module since AMB 24 buffers data from DRAM chips 22 to metal contact pads 12. DRAM chips 22 do not send and receive data directly from metal contact pads 12 as in many prior memory module standards. Since DRAM chips 22 do not directly communicate data with metal contact pads 12, signals on metal contact pads 12 can operate at very high data rates.

Figure 2:
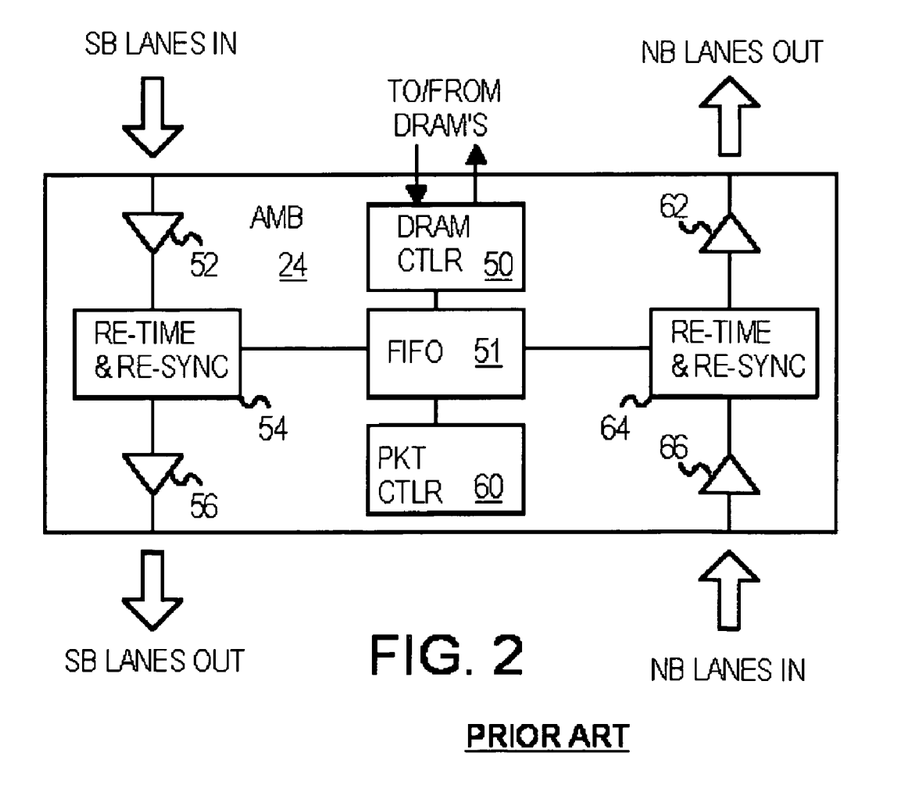
FIG. 2 shows detail of an advanced memory buffer on a fully-buffered memory module.

FIG. 2 shows detail of an advanced memory buffer on a fully-buffered memory module. AMB 24 contains DRAM controller 50, which generates DRAM control signals to read and write data to and from DRAM chips 22 on memory module 10. Data is temporarily stored in FIFO 51 during transfers.

The data from FIFO 51 is encapsulated in frames that are sent over differential signals through metal contact pads 12. Rather than being sent directly to the host central processing unit (CPU), the frames are passed from one memory module to the next memory module, along a daisy chain series of memory modules, until the frame reaches the host CPU. Differential data lines in the direction toward the host CPU are known as northbound lanes, while differential data lines from the CPU toward the memory modules are known as southbound lanes.

When a frame is sent from the host CPU toward a memory module, the frame is sent over the southbound lanes toward one of the memory modules in the daisy chain. Each memory module passes the frame along to the next memory module in the daisy chain. Southbound lanes that are input to a memory module are buffered by its AMB 24 using re-timing and re-synchronizing buffers 54. Re-timing and re-synchronizing buffers 54 restore the timing of the differential signals prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 51 and processed by AMB 24. For example, for a write frame, the data from FIFO 51 is written to DRAM chips 22 on the memory module by AMB 24. For a read, the data read from DRAM chips 22 is stored in FIFO 51. AMB 24 forms a frame and sends the frame to northbound re-timing and re-synchronizing buffers 64 and out over the northbound lanes from differential output buffer 62. Input buffers 66 and output buffers 62 contain differential receivers and transmitters for the northbound lanes that are buffered by re-timing and re-synchronizing buffers 64.

Forming outgoing frames and examining packet headers of incoming frames are performed by packet controller 60. Packet controller 60 may support a variety of frame sizes, formats, and features that may be programmable.

Figure 3:
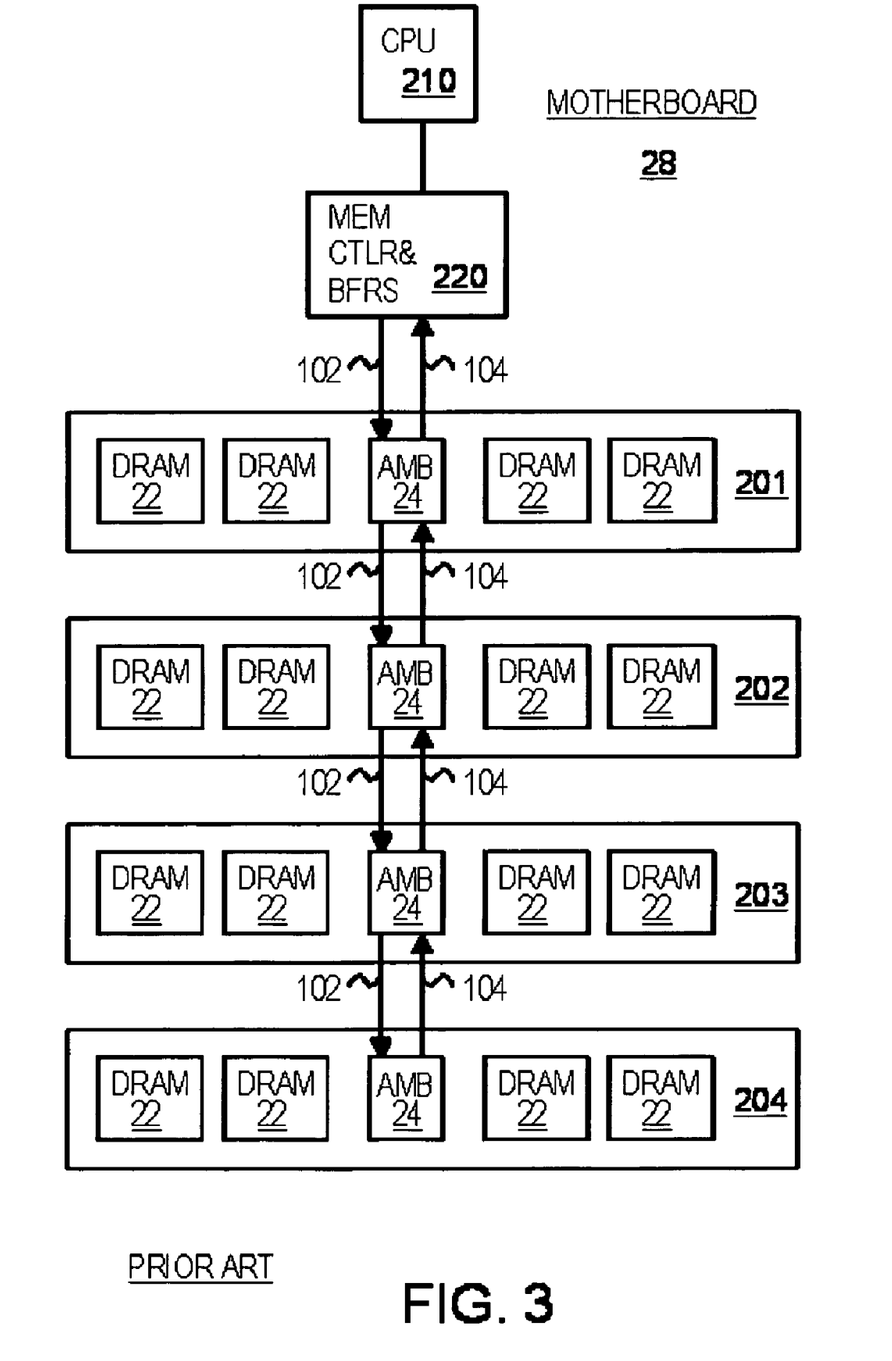
FIG. 3 shows fully-buffered memory modules daisy chained together in a series.

FIG. 3 shows fully-buffered memory modules daisy chained together in a series. Host CPU 210 on motherboard 28 reads and writes main memory in DRAM chips 22 on memory modules 201-204 through memory controller 220 on motherboard 28. Memory modules 201-204 are inserted into memory module sockets on motherboard 28.

Rather than read and write DRAM chips 22 directly, host CPU 210 sends read and write commands in packets or frames that are sent over southbound lanes 102. The frame from host CPU 210 is first sent from memory controller 220 to first memory module 201 in the first socket. AMB 24 on first memory module 201 examines the frame to see if it is intended for first memory module 201 and re-buffers and passes the frame on to second memory module 202 over another segment of southbound lanes 102. AMB 24 on second memory module 202 examines the frame and passes the frame on to third memory module 203. AMB 24 on third memory module 203 examines the frame and passes the frame on to fourth memory module 204.

When data is read, or a reply frame is sent back to host CPU 210, northbound lanes 104 are used. For example, when DRAM chips 22 on third memory module 203 are read, the read data is packaged in a frame by AMB 24 and sent over northbound lanes 104 to second memory module 202, which re-buffers the frame and sends it over another segment of northbound lanes 104 to first memory module 201. First memory module 201 then re-buffers the frame of data and sends it over northbound lanes 104 to memory controller 220 and on to host CPU 210.

Since northbound lanes 104 and southbound lanes 102 are composed of many point-to-point links between adjacent memory modules, the length and loading of these segments is reduced, allowing for higher speed signaling. Signaling is to AMB 24 on each memory module rather than to DRAM chips 22.

When branches are included in a physical bus link, there are 3 or more endpoints. Reflections may occur from the third endpoint (stub) and create distortions for signals being sent between the other two endpoints. Terminating the branching physical bus link is more difficult and less effective than when a physical bus link has only two endpoints. Thus southbound lanes 102 and northbound lanes 104 are composed of physical bus links having only 2 endpoints. A serial chain of fully-buffered memory modules has been the most obvious and widely used topology since it is a natural extension of the 2-endpoint physical links.

While such a daisy chain of fully-buffered memory modules is useful, memory modules at the end of a long serial chain of memory modules have increased delays or latencies for data to and from the CPU at the head of the chain. The data has to pass through and be buffered and re-timed by each of the intervening memory modules, resulting in significant delays. For example, data read from last memory module 204 has to pass through three other memory modules 201, 202, 203 to reach memory controller 220. It is desirable to reduce such delays by improving the memory-bus topology.

DETAILED DESCRIPTION

The present invention relates to an improvement in memory buses for memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the serial chain topology used by fully-buffered memory modules is undesirable for larger memory systems. Current AMB's have only one uplink port and one downlink port, resulting in a serial daisy chain topology. The inventor realizes that branches in the bus topology may be introduced by using a branching AMB that has two or more downlink ports with one uplink port. The inventor's related application disclosed a fully-buffered memory module using a branching AMB to introduce branches into the daisy chain bus topology. This branching memory module reduced the number of memory modules between end modules and the CPU. Branches can thus reduce delays from end memory modules to the host CPU.

The inventor has further realized that a dummy module without memory may be constructed. This branching memory-bus module does not contain memory. The branching memory-bus module has a branching AMB, and has multiple downlink ports that can connect to several branches of standard fully-buffered memory modules. Thus the branching memory-bus module introduces branches in the memory-bus topology, reducing delays to standard fully-buffered memory modules at the end of the branches.

Figure 4:
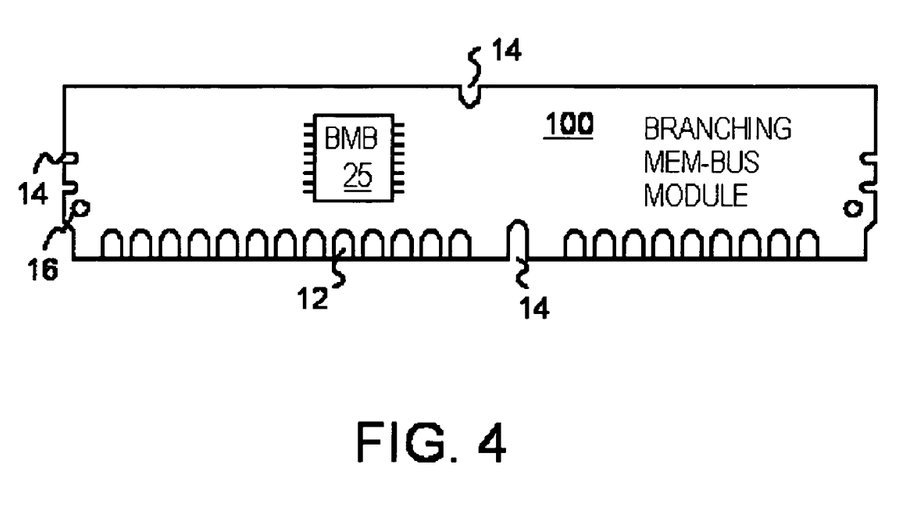
FIG. 4 shows a branching memory-bus module without memory on the module.

FIG. 4 shows a branching memory-bus module without memory on the module. Branching memory-bus module 100 can have the same form factor and fit into the same memory module sockets as standard fully-buffered memory modules, although some pins may need to be re-assigned for the additional downlink ports that branch from branching memory-bus module 100. Branching memory-bus module 100 could also be somewhat smaller in height than a standard fully-buffered memory module, or could be wider to fit into a wider memory module socket that has additional I/O pins for the additional downlink branches.

Branching memory-bus module 100 contains a substrate such as a multi-layer printed-circuit board (PCB) with branching advanced memory buffer (BMB) 25 on memory module 100. Metal contact pads 12 are positioned along the bottom edge of the module on both front and back surfaces. Metal contact pads 12 mate with pads on a module socket to electrically connect the module to a PC's motherboard.

Holes 16 are present on some kinds of modules to ensure that the module is correctly positioned in the socket. Notches 14 also ensure correct insertion of the module. Capacitors or other discrete components are surface-mounted on the substrate to filter noise.

BMB 25 is a chip mounted onto the substrate of memory module 100 to support differential signaling through metal contact pads 12. BMB 25 sends and receives external packets or frames of data and commands to other memory modules in other sockets over differential data lines in metal contact pads 12.

Figure 5:
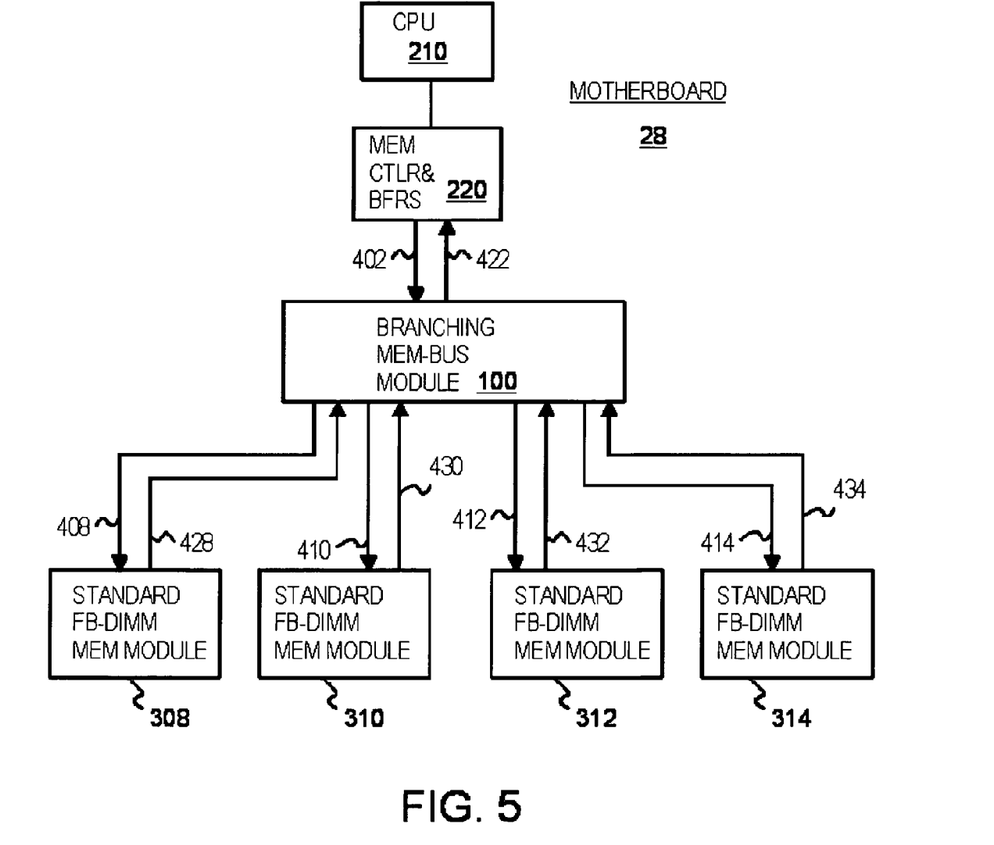
FIG. 5 shows a branching memory-bus module forming branches in a memory-bus topology.

FIG. 5 shows a branching memory-bus module forming branches in a memory-bus topology. Host CPU 210 on motherboard 28 reads and writes main memory in DRAM chips on standard memory modules 308-314 through memory controller 220 on motherboard 28. Standard memory modules 308-314 are fully-buffered memory modules inserted into memory module sockets on motherboard 28.

Branching memory-bus module 100 receives data such as commands and write data from host CPU 210 over southbound lanes 402 and sends data such as status and read data to host CPU 210 over northbound lanes 422.

Branching memory-bus module 100 receives data from host CPU 210 over southbound lanes 402 and passes this data to a multiple downlink ports on southbound lanes 408 to memory module 308, southbound lanes 410 to memory module 310, southbound lanes 412 to memory module 312, and southbound lanes 414 to memory module 314.

Data from downstream memory modules 308, 310, 312, 314 on northbound lanes 428, 430, 432, 434 are combined by branching memory-bus module 100 and passed on the uplink of northbound lanes 422 to CPU 210.

Since each of southbound lanes 402, 408, 410, 412, 414 and each of northbound lanes 422, 428, 430, 432, 434 have only two endpoints, signal distortion from a third endpoint or stub is avoided even though branching is supported.

Terminal-end fully-buffered memory modules 308, 310, 312, 314 can be standard prior-art fully-buffered memory modules that do not support branching, since there are no downlinks from these terminal-end memory modules.

Rather than read and write DRAM chips directly, host CPU 210 sends read and write commands in packets or frames that are sent over southbound lanes 402. The frame from host CPU 210 is first sent from memory controller 220 to branching memory-bus module 100 in the branching socket. The branching AMB on branching memory-bus module 100 examines the frame and re-buffers and passes the frame on to one or more of memory modules 308, 310, 312, 314.

When data is read, or a reply frame is sent back to host CPU 210, northbound lanes are used. For example, when DRAM chips on memory module 308 are read, the read data is packaged in a frame by its AMB and sent over northbound lanes 428 to branching memory-bus module 100, which re-buffers the frame and sends it over northbound lanes 422 to memory controller 220 and on to host CPU 210.

Since northbound lanes and southbound lanes are composed of many point-to-point links between branching memory-bus module 100 and adjacent memory modules, the length and loading of these segments is reduced, allowing for higher speed signaling. Signaling is to and from branching AMB's on each memory module rather than to DRAM chips on the memory modules.

Four standard fully-buffered memory modules 308-314 are supported, yet only one intervening module, branching memory-bus module 100, is between each memory module and memory controller 220. The worst-case delay has been reduced to just 1 intervening module from the 3 intervening modules 201-203 for final (terminal end) memory module 204 of the prior-art memory bus of FIG. 3. Thus worst-case delay has been reduced by about 66%.

Figure 6:
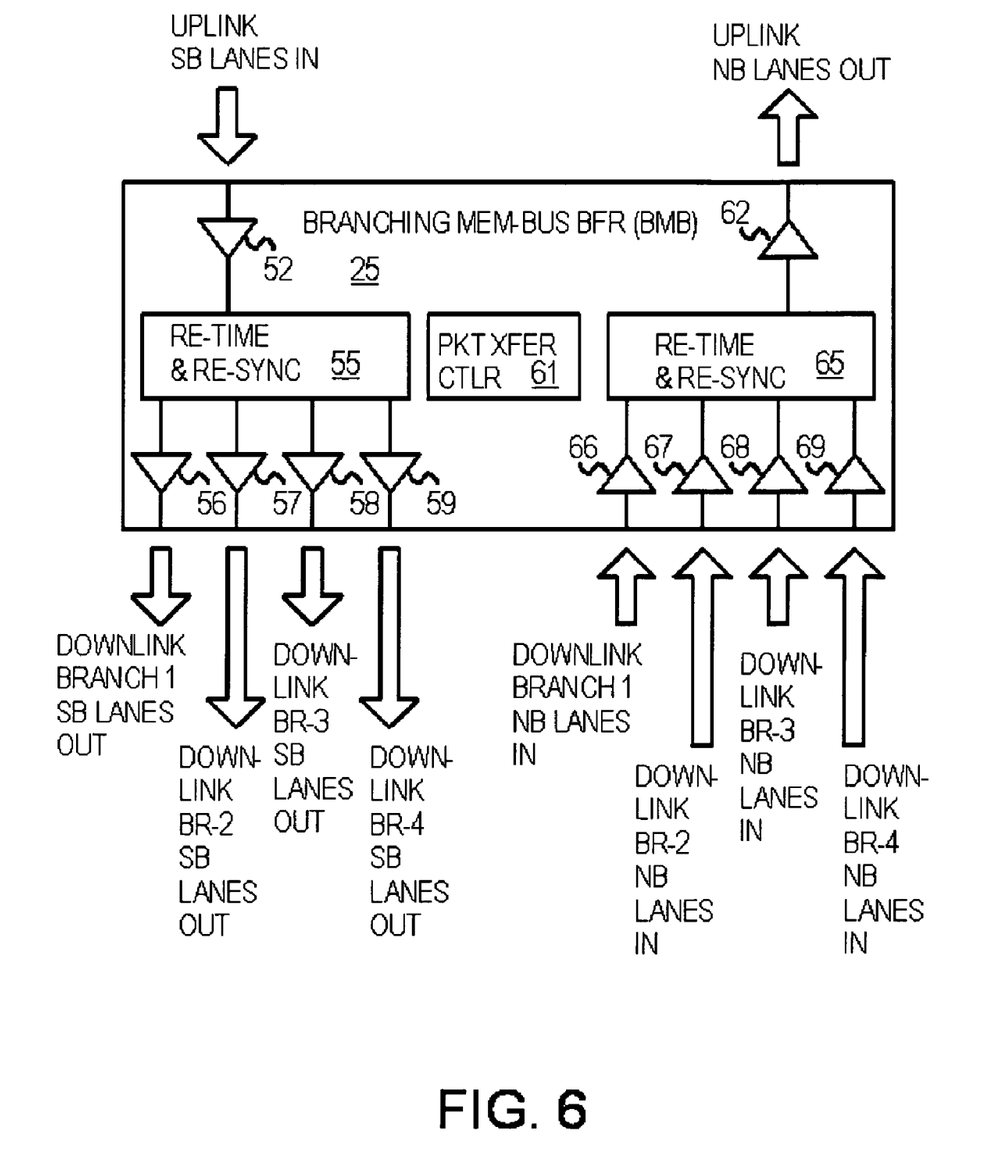
FIG. 6 shows a branching Advanced Memory Buffer (BMB) on a branching memory-bus module.

FIG. 6 shows a branching Advanced Memory Buffer (BMB) on a branching memory-bus module. Branching AMB 25 supports four downlink ports (branch 1-4) but only one uplink port. In the context of FIG. 6, branching AMB 25 is synonymous with branching memory-bus buffer (BMB).

Southbound lanes that are input to a branching memory-bus module are buffered by its branching AMB 25 using re-timing and re-synchronizing buffers 55. Re-timing and re-synchronizing buffers 55 restore the timing of the differential signals prior to retransmission and replicate the frame to one or more of output buffers 56, 57, 58, 59 for the four downlink ports. Input buffers 52 and output buffers 56-59 contain differential receivers and transmitters for the southbound lanes that are buffered by re-timing and re-synchronizing buffers 55.

Downlink data from any of the four downlink branches received by input buffers 66-69 are combined by re-timing and re-synchronizing buffers 65 into one data stream that is sent out of the uplink port by output buffers 62. For example, downlink data from a downstream memory module on branch 1 is received by input buffers 66 and combined by re-timing and re-synchronizing buffers 65 with downlink data from a downstream memory module on branch 3 that is received by input buffers 68. The combined data stream is output by output buffers 62 and sent over the uplink port's northbound lanes.

Combining incoming frames and forming outgoing frames is performed by packet transfer controller 61. Packet transfer controller 61 may support a variety of frame sizes, formats, and features that may be programmable. The operation of combining frames from two or more downlink ports may be accomplished directly by re-timing and re-synchronizing buffers 65, or may require that some data be buffered in a local FIFO (not shown) when two or more downlink branches are receiving at the same time. The frames may be kept separate and buffered or delayed or may be combined into larger frames by packet transfer controller 61.

Figure 7:
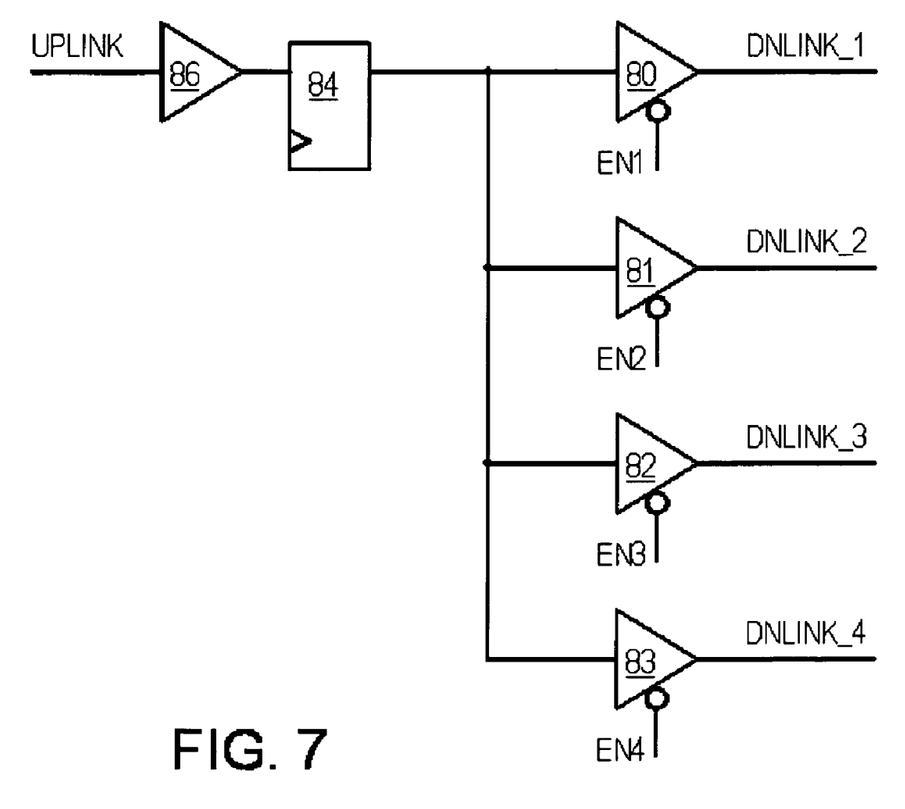
FIG. 7 is a schematic of downstream packet re-transmission in a branching AMB in a branching memory-bus module.

FIG. 7 is a schematic of downstream packet re-transmission in a branching AMB in a branching memory-bus module. Downstream packets are received from the host or another branching memory-bus module by input buffer 86 on the uplink port. The received data is clocked into input register 84 by a receive clock or by a local clock. The received data is then re-timed and transmitted out on one or more of the four downlink ports by output buffers 80-83. These output buffers may be separately enabled by an enable signal from the memory controller or other chips on the motherboard, or by a port select field in a packet header of a packet sent from the memory controller. Alternately, all four output buffers 80-83 may be enabled and packets sent to all four downlink ports.

Figure 8:
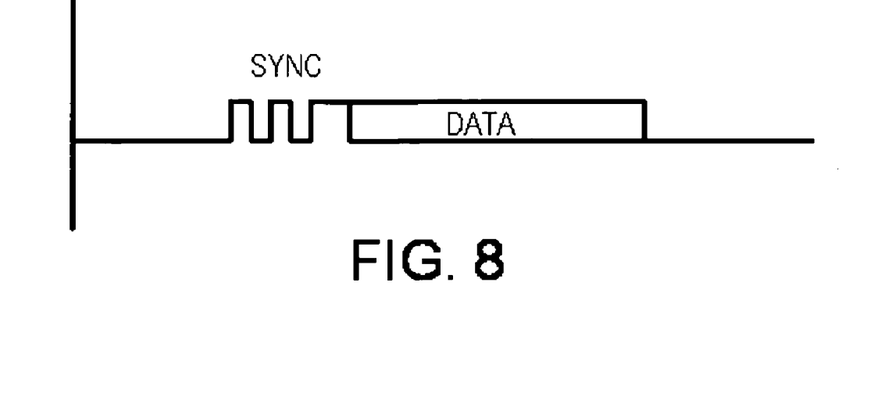
FIG. 8 shows a sync field in front of a frame.

FIG. 8 shows a sync field in front of a frame. When no data is being transmitted, transmitters are turned off or placed in a high-impedance state, or an idle pattern may be transmitted. Power consumption may be reduced when no frame is being transmitted.

When a frame is to be transmitted, the transmitter is turned on and a pre-determined series of bits (the sync pattern) is transmitted first. For example, the sync pattern can be a repetitive series of bits with a high data transition density. The sync pattern could be alternating 1's and 0's that ends with a "11". After the sync pattern is transmitted, data in the frame can be sent. The end of the frame can be indicated by an end-of-frame pattern, or by a frame length (fixed or variable) being reached. At the end of the frame, the transmitter again becomes idle and in a high-impedance state to allow other transmitters to drive the physical line.

When upstream frames contain sync patterns, the branching AMB may be able to detect the start of a new frame by detecting this sync pattern on a downlink receiver. The port with the detected sync pattern may then be selected and the other ports de-selected, allowing the frame to be repeated to the uplink transmitter. The branching AMB can re-synchronize to the received sync pattern at the start of every frame.

Some frames may not use sync patterns, or may use idle patterns between frames that actively drive data high and low. The idle pattern of one downlink port may be selected to be repeated to the uplink port, or the branching AMB chip may generate its own idle pattern for transmission out of the uplink port.

Figure 9:
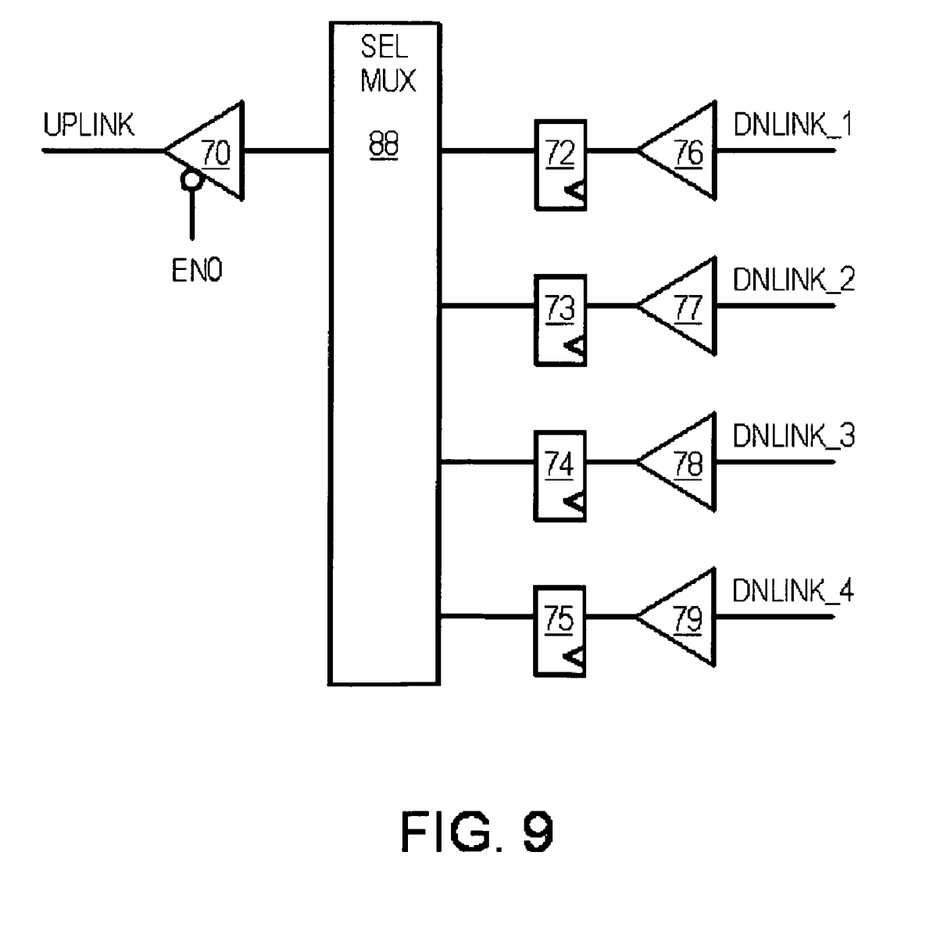
FIG. 9 is a schematic of upstream packet re-transmission in a branching AMB in a branching memory-bus module.

FIG. 9 is a schematic of upstream packet re-transmission in a branching AMB in a branching memory-bus module. Upstream packets are received by downlink input buffers 76-79 and are latched and re-timed by registers 72-75. The clock to registers 72-75 can be one of the receiver clocks from one of the four downlink ports, or can be a local clock. For example, when one of the four downlink ports is sending a frame and the other ports are idle, the clock for the transmitting port can be selected and used to re-transmit the frame.

Selector 88 selects one of the four registers 72-75 for re-transmission to the uplink port by output buffer 70. Selection of one of the four downlink ports may be controlled by a hardware signal from the memory controller, by detection of a sync pattern on one of input buffers 76-79 from a frame being transmitted upstream, or by a field in a downstream frame that was previously sent from the memory controller.

For embodiments that have active idle patterns, all of the downstream ports may always be receiving active signals. Re-timing when switching from one port's frame to another port's frame may be more difficult. Elastic buffers may be added to allow bit resynchronization and synchronously merge frames.

Figure 10:
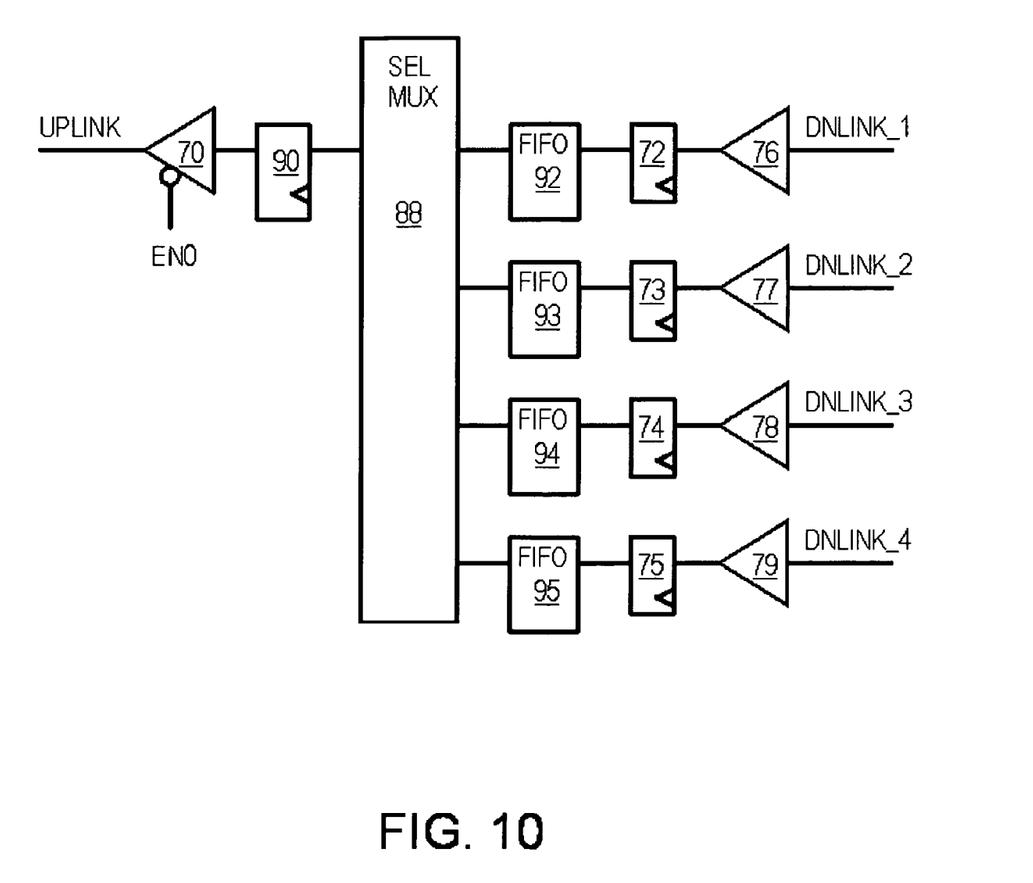
FIG. 10 shows upstream synchronous merging of frames using elastic buffers.

FIG. 10 shows upstream synchronous merging of frames using elastic buffers. FIFO's 92-95 are inserted between registers 72-75 and selector 88. FIFO's 92-95 clock in data from input buffers 72-75 using receive clocks for each of the four downlink ports. Data is clocked out of FIFO's 92-95 using a transmit clock or an intermediate clock. Selector 88 can merge data from different downlink ports into a continuous data stream that can be sent upstream. Retransmit buffer 90 resynchronizes the merged data to the transmit clock to the uplink port.

A sync detector (not shown) can examine the uplink and downlink lines and signal when a complete sync pattern is detected. Then the data following the sync pattern can be captured and examined, or repeated to other ports. A new sync pattern can be generated, or the sync pattern can also be captured and repeated. The sync pattern can be a bit sequence that is never found in regular data.

Figure 11:
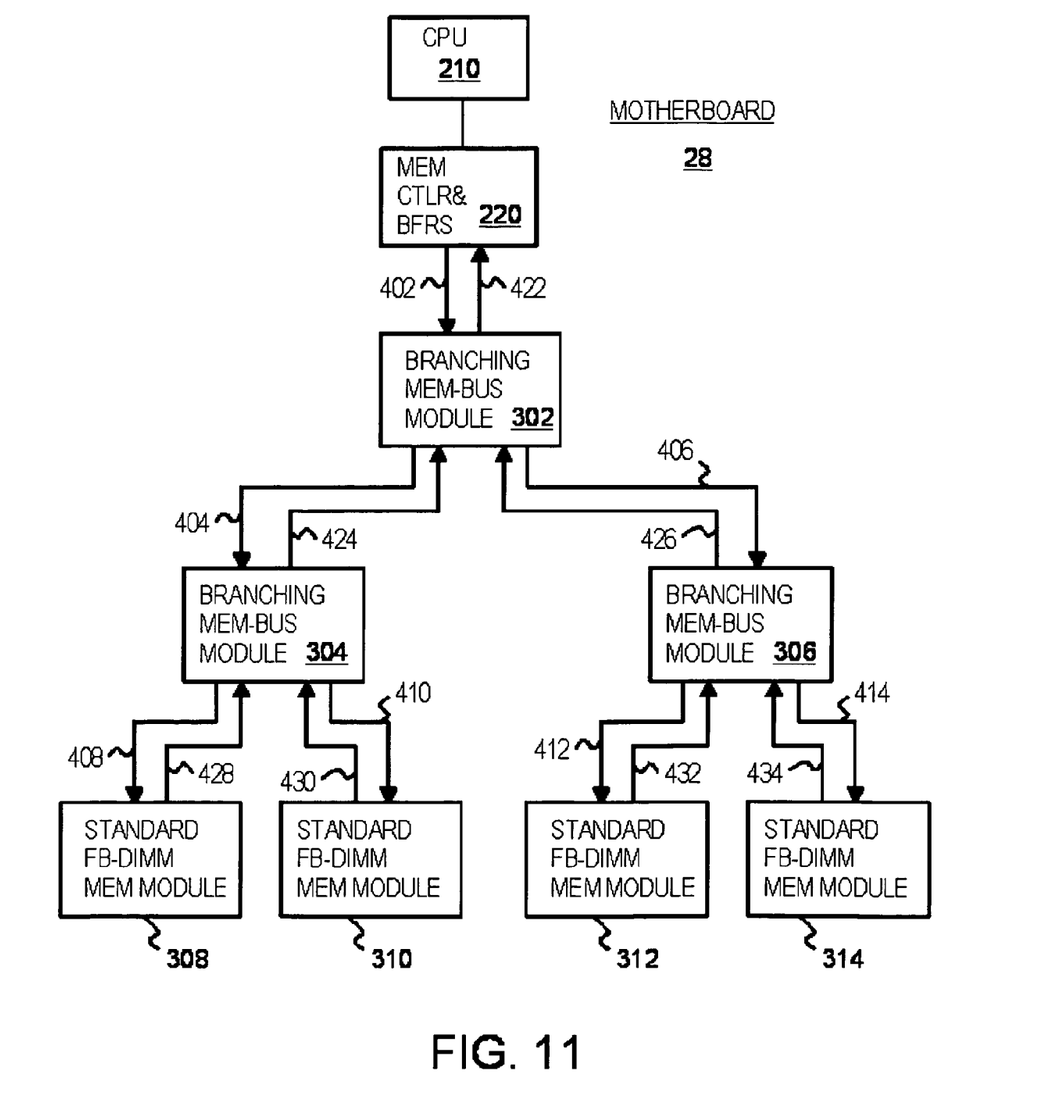
FIG. 11 shows three branching memory-bus modules forming branches in a memory-bus topology.

FIG. 11 shows three branching memory-bus modules forming branches in a memory-bus topology. Host CPU 210 on motherboard 28 reads and writes main memory in DRAM chips on standard memory modules 308-314 through memory controller 220 on motherboard 28. Standard memory modules 308-314 are fully-buffered memory modules inserted into memory module sockets on motherboard 28.

In this embodiment, each of branching memory-bus modules 302-306 has just two downlink ports, although four or some other number could be substituted for larger bus structures.

First branching memory-bus module 302 receives data such as commands and write data from host CPU 210 over southbound lanes 402 and sends data to host CPU 210 over northbound lanes 422. Data from host CPU 210 is passed on to branching memory-bus module 304 over southbound lanes 404 and also to branching memory-bus module 306 over southbound lanes 406. Thus data from host CPU 210 from southbound lanes 402 is copied by branching memory-bus module 302 to both southbound lanes 404, 406, to two downstream branching memory-bus modules 304, 306.

Data bound for host CPU 210 from either of branching memory-bus modules 304, 306 on either set of northbound lanes 424, 426 is combined by branching memory-bus module 302 and sent over northbound lanes 422. Status and read data are framed and sent upstream toward host CPU 210. The frames are repeated by each intervening module in the path to host CPU 210.

Second-level branching memory-bus module 304 receives data from host CPU 210 over southbound lanes 404 from branching memory-bus module 302, and passes this data to a pair of downlink ports on southbound lanes 408 to memory module 308, and southbound lanes 410 to memory module 310. Data from downstream memory modules 308, 310 on northbound lanes 428, 430 are combined by branching memory-bus module 304 and passed on the uplink of northbound lanes 424.

Likewise, second-level branching memory-bus module 306 receives data from host CPU 210 over southbound lanes 406 from branching memory-bus module 302, and passes this data to a pair of downlink ports on southbound lanes 412 to memory module 312, and southbound lanes 414 to memory module 314. Data from downstream memory modules 312, 314 on northbound lanes 432, 434 are combined by branching memory-bus module 306 and passed on the uplink of northbound lanes 426.

Since each of southbound lanes 402, 404, 406, 408, 410, 412, 414 and each of northbound lanes 422, 424, 426, 428, 430, 432, 434 have only two endpoints, signal distortion from a third endpoint or stub is avoided even though branching is supported.

Terminal-end fully-buffered memory modules 308, 310, 312, 314 could be prior-art fully-buffered memory modules that do not support branching, since there are no downlinks from these terminal-end memory modules.

Rather than read and write DRAM chips directly, host CPU 210 sends read and write commands in packets or frames that are sent over southbound lanes 402. The frame from host CPU 210 is first sent from memory controller 220 to first branching memory-bus module 302 in the first socket. The branching AMB on first branching memory-bus module 302 passes the frame on to one or both of second-level branching memory-bus modules 304, 306 over two downlinks of southbound lanes 404, 406. The branching AMB's on second-level branching memory-bus modules 304, 306 pass the frame on to final memory modules 308, 310, 312, 314.

When data is read, or a reply frame is sent back to host CPU 210, northbound lanes are used. For example, when DRAM chips on final (terminal end) memory module 308 are read, the read data is packaged in a frame by its AMB and sent over northbound lanes 428 to second-level branching memory-bus module 304, which re-buffers the frame and sends it over northbound lanes 424 to first branching memory-bus module 302. First branching memory-bus module 302 then re-buffers the frame of data and sends it over northbound lanes 422 to memory controller 220 and on to host CPU 210.

Since northbound lanes and southbound lanes are composed of many point-to-point links between adjacent memory modules, the length and loading of these segments is reduced, allowing for higher speed signaling. Signaling is to and from branching AMB's on each memory module rather than to DRAM chips on the memory modules. Delays due to intervening memory modules are reduced, or additional memory modules are supported with the same delays, due to the branched bus topology.

Bi-Directional Northbound and Southbound Lanes

Having separate northbound and southbound lanes avoids any collisions between frames going upstream and frames going downstream, since upstream and downstream frames are sent over different physical lines. However, having separate upstream and downstream lines increases costs, since separate input-output (I/O) buffers and pads are needed on the chip, and separate physical lines (traces or wires) are needed on the motherboard or other circuit board.

The inventor has realized that bidirectional lines could be used by branching memory-bus modules. Rather than have separate northbound and southbound lanes, only one set of lanes is provided. The provided lanes are bidirectional and carry both northbound (upstream) frames and southbound (downstream) frames.

The inventor has further realized that fully-buffered memory modules are often used in a host-controlled system utilizing a polling protocol. Host CPU 210 controls communications as the bus master and polls memory modules for status information or read data. Host CPU 210, or memory controller 220, sends requests in downstream frames to memory modules, and waits for response frames sent upstream by the requested memory modules. The memory modules do not asynchronously initiate communications, but only respond to request from the host.

Collisions between downstream and upstream frames should not occur as long as the host waits for a response before sending another request. If the host sends multiple requests, collisions between a second host request in a downstream frame and a reply in an upstream frame might occur. For a "strict" polling protocol, multiple requests do not occur. Multiple requests might occur if the multiple requests are sent out in succession from the host and the memory modules wait for a "silence period" before responding. Multiple requests can also be buffered (stored) in the intervening southbound paths. Collisions among frames from different memory modules might also occur during a fault condition.

Figure 12:
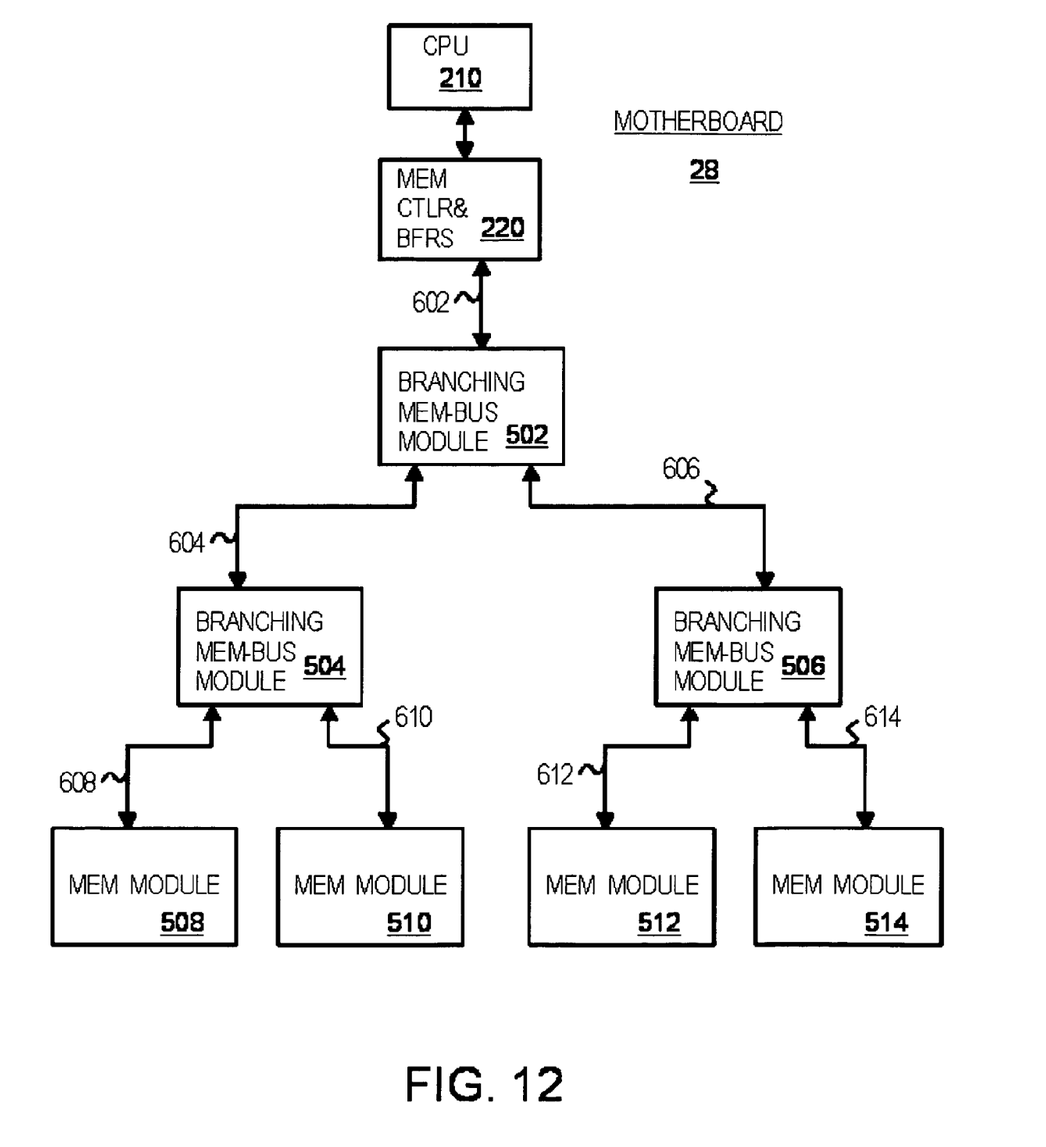
FIG. 12 shows branching memory-bus modules using bidirectional lanes.

FIG. 12 shows branching memory-bus modules using bidirectional lanes. Host CPU 210 on motherboard 28 reads and writes main memory in DRAM chips on memory modules 508-514 through memory controller 220 on motherboard 28. Memory modules 508-514 are inserted into memory module sockets on motherboard 28.

Rather than have separate northbound lanes and southbound lanes for each bus segment, only one set of bidirectional lanes are provided that are shared for both upstream (northbound) and downstream (southbound) directions.

First branching memory-bus module 502 receives data such as commands and write data from host CPU 210 over bidirectional lanes 602 and sends data to host CPU 210 over the same bidirectional lanes 602. Data from host CPU 210 is passed on to branching memory-bus module 504 over bidirectional lanes 604 and also to branching memory-bus module 506 over bidirectional lanes 606. Thus data from host CPU 210 from bidirectional lanes 602 is copied by branching memory-bus module 502 to both bidirectional lanes 604, 606, to two downstream branching memory-bus modules 504, 506.

Data bound for host CPU 210 from either of branching memory-bus modules 504, 506 on either set of bidirectional lanes 604, 606 is combined by branching memory-bus module 502 and sent over bidirectional lanes 602. Status and read data are framed and sent upstream toward host CPU 210. The frames are repeated by each intervening memory module in the path to host CPU 210.

Second-level branching memory-bus module 504 receives data from host CPU 210 over bidirectional lanes 604 from branching memory-bus module 502, and passes this data to a pair of downlink ports on bidirectional lanes 608 to memory module 508, and bidirectional lanes 610 to memory module 510. Data from downstream memory modules 508, 510 on bidirectional lanes 608, 610 are combined by branching memory-bus module 504 and passed on the uplink of bidirectional lanes 604.

Likewise, second-level branching memory-bus module 506 receives data from host CPU 210 over bidirectional lanes 606 from branching memory-bus module 502, and passes this data to a pair of downlink ports on bidirectional lanes 612 to memory module 512, and bidirectional lanes 614 to memory module 514. Data from downstream memory modules 512, 514 on bidirectional lanes 612, 614 are combined by branching memory-bus module 506 and passed on the uplink of bidirectional lanes 606.

Since each of bidirectional lanes 602, 604, 606, 608, 610, 612, 614 have only two endpoints, signal distortion from a third endpoint or stub is avoided even though branching is supported. Collisions are generally avoided since host CPU 210 usually waits for a response rather than sending additional frames.

Since bidirectional lanes pass frames in either direction, the number of physical lines and I/O can be reduced by as much as 50%. Cost, die area, and board area are reduced. Power consumption is also reduced due to the fewer I/O and also since unused lanes are powered down when no frame is being sent.

ALTERNATE EMBODIMENTS

Several other embodiments are contemplated by the inventor. For example, rather than use digital FIFO memories, programmable delay lines may be used for elastic buffers. Branching memory-bus modules may be mixed with prior-art serial fully-buffered memory modules in the same system. A branching memory-bus module may be inserted near the host CPU and standard fully-buffered memory modules inserted in the two branches. Rather than have the branching memory-bus module plug into a socket, the module could be integrated directly onto the motherboard or onto a memory sub-system board. For example, a branching memory-bus device has the branching AMB chip that could be mounted directly onto the motherboard while memory module sockets are provided for the standard fully-buffered memory modules on the downlink branches from the branching AMB chip.

The circuitry of FIG. 7, 9, or 10 may be repeated for parallel data sent over many parallel lanes. For example, 8 data bits may be transmitted at a time over 8 lanes that are bi-directional by having 8 drivers, 8 buffers, 8 registers, etc. Furthermore, the physical lanes may be differential with two physical lines per bit, with a true and complement line per bit. A bit aligner may be added to remove any bit-to-bit skew among parallel bits on lanes in parallel.

While a branching AMB with 2 downlink ports or 4 downlink ports has been described, each branching memory-bus module could have three, four, or more downlink ports. The number of northbound and southbound lanes may vary and differ, such as 8 northbound lanes but only 4 southbound lanes. Different links may operate at different speeds, and frames may be stored and forwarded to slower-speed links. Frames may also be fragmented, serialized, or combined in a variety of ways.

One host CPU may have multiple memory channels and multiple memory controllers may be used. The memory controller may be integrated onto the same chip with the host processor.

Future memory module standards and extensions of the fully-buffered DIMM standard could benefit from the invention. Additional components could be added, such as echo cancellation for bi-directional full-duplex transmission, pre- and post-equalization circuits, resistors, capacitors, filters, multi-level coders/decoders, etc. Inter-symbol interference could be reduced by using pre-equalization and post-equalization circuitry. Multi-level signaling and coding such as 4B/5B could be used.

Collision detect circuits could be added to detect collisions, and the frame could be halted or backed off when a collision is detected during transmission of a sync pattern. Store-and-forward or other switching techniques can be used for frames arriving at the same time.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A branching fully-buffered memory-bus module comprising:
    a substrate containing wiring traces for conducting signals;
    a plurality of contact pads along a first edge of the substrate, the plurality of contact pads for mating with a memory module socket on a motherboard;
    a branching Advanced Memory Buffer (AMB) mounted on the substrate for buffering host data;
    uplink contact pads, in the plurality of contact pads, that carry southbound uplink frames of the host data generated by the host for writing to memory chips in downstream memory modules, and that carry northbound uplink frames of host data read from memory chips in downstream memory modules toward the host;
    first downlink contact pads, in the plurality of contact pads, that carry first southbound downlink frames of the host data generated by the host for writing to a first plurality of memory chips in a first downstream memory module in a first branch, and that carry first northbound downlink frames of host data read from the first plurality of memory chips in the first downstream memory module in the first branch;
    second downlink contact pads, in the plurality of contact pads, that carry second southbound downlink frames of the host data generated by the host for writing to a second plurality of memory chips in a second downstream memory module in a second branch, and that carry second northbound downlink frames of host data read from the second plurality of memory chips in the second downstream memory module in the second branch;
    wherein the branching AMB connects through the wiring traces to the uplink contact pads, to the first downlink contact pads, and to the second downlink contact pads;
    a replicator, in the branching AMB, for copying the southbound uplink frames received from the uplink contact pads to the first downlink contact pads to generate the first southbound downlink frames, and for copying the southbound uplink frames received from the uplink contact pads to the second downlink contact pads to generate the second southbound downlink frames; and
    a northbound merger, in the branching AMB, for transferring the first northbound downlink frames received from the first downlink contact pads to the uplink contact pads to generate the northbound uplink frames, and for transferring the second northbound downlink frames received from the second downlink contact pads to the uplink contact pads to generate the northbound uplink frames,
    whereby the branching fully-buffered memory-bus module replicates southbound uplink frames to generate both the first southbound downlink frames to the first branch of the first downstream memory module and the second southbound downlink frames to the second branch of the second downstream memory module.

2. The branching fully-buffered memory-bus module of claim 1 wherein the uplink contact pads, the first downlink contact pads, and the second downlink contact pads each carry signals to stubless lines having exactly two endpoints,
    wherein the branching AMB is a first endpoint and a first AMB in the first downstream memory module is a second endpoint for stubless lines connected through the first downlink contact pads;
    wherein the branching AMB is a first endpoint and a second AMB in the second downstream memory module is a second endpoint for stubless lines connected through the second downlink contact pads, whereby point-to-point signal lines without stubs connect to downstream memory modules.

3. The branching fully-buffered memory-bus module of claim 1 wherein the uplink contact pads comprise a pair of differential pads for carrying differential data over an uplink pair of signal lines;

wherein the first downlink contact pads comprise a pair of differential pads for carrying differential data over a first pair of signal lines;

wherein the second downlink contact pads comprise a pair of differential pads for carrying differential data over a second pair of signal lines, whereby differential data is signaled.

4. The branching fully-buffered memory-bus module of claim 3 wherein the uplink pair of signal lines carry both the southbound uplink frames and the northbound uplink frames, wherein the uplink pair of signal lines is bidirectional;

wherein the first downlink pair of signal lines carry both the first southbound downlink frames and the first northbound downlink frames, wherein the first downlink pair of signal lines is bidirectional;

wherein the second downlink pair of signal lines carry both the second southbound downlink frames and the second northbound downlink frames, wherein the second downlink pair of signal lines is bidirectional, whereby frames are sent over bidirectional signal lines.

5. The branching fully-buffered memory-bus module of claim 4 wherein the southbound uplink frames, the northbound uplink frames, the first southbound downlink frames, the first northbound downlink frames, the second southbound downlink frames, and the second northbound downlink frames each comprise:

a sync pattern having a predetermined sequence of bits that precedes the host data in a frame;

whereby the sync pattern begins transmission of the frame of the host data.

6. The branching fully-buffered memory-bus module of claim 1 wherein the uplink contact pads comprise:

a northbound pair of differential pads for carrying the northbound uplink frames as differential data over a northbound uplink pair of signal lines;

a southbound pair of differential pads for carrying the southbound uplink frames as differential data over a southbound uplink pair of signal lines;

wherein the first downlink contact pads comprise:

a first northbound pair of differential pads for carrying the first northbound downlink frames as differential data over a first northbound downlink pair of signal lines;

a first southbound pair of differential pads for carrying the first southbound downlink frames as differential data over a first southbound downlink pair of signal lines;

wherein the second downlink contact pads comprise:

a second northbound pair of differential pads for carrying the second northbound downlink frames as differential data over a second northbound downlink pair of signal lines; and a second southbound pair of differential pads for carrying the second southbound downlink frames as differential data over a second southbound downlink pair of signal lines, whereby differential data is signaled over separate northbound and southbound pairs of differential lines.

7. A branching memory subsystem comprising:

a plurality of industry-standard fully-buffered memory modules that contain memory chips for storing read data, the memory chips having data signals that are not directly connected to contact pads on a fully-buffered memory module but are connected through an Advanced Memory Buffer (AMB) on the fully-buffered memory module;

a host memory controller for generating southbound frames containing write data or read requests, and for receiving northbound frames containing read data in response to the read requests that are read from the memory chips in the plurality of industry-standard fully-buffered memory modules;

a branching memory-bus device between the host memory controller and the plurality of industry-standard fully-buffered memory modules, wherein the branching memory-bus device comprises:

uplink port means for sending northbound frames with read data toward the host memory controller and for receiving southbound frames with write data from the host memory controller;

first branching downlink port means for receiving northbound frames with read data toward the host memory controller and for sending southbound frames with write data from the host memory controller;

second branching downlink port means for receiving northbound frames with read data toward the host memory controller and for sending southbound frames with write data from the host memory controller;

buffer device means, coupled to the uplink port means, to the first branching downlink port means, and to the second branching downlink port means, for receiving and re-timing southbound frames from the uplink port means, and for replicating the southbound frames and sending the southbound frames out of the first branching downlink port means and out of the second branching downlink port means;

combining means, in the buffer device means, for receiving and re-timing northbound frames from the first branching downlink port means and from the second branching downlink port means and for re-transmitting northbound frames out of the uplink port means, whereby the uplink port means branches into two downlink port means at the branching memory-bus device.

8. The branching memory subsystem of claim 7 wherein the uplink port means, the first branching downlink port means, and the second branching downlink port means each further comprises:

differential driver means for driving serial data over a pair of differential lines;

differential receiver means for receiving differential data from a pair of differential lines;

register means for re-timing received data to a clock, whereby differential data is transmitted and received.

9. The branching memory subsystem of claim 8 wherein the differential driver means and the differential receiver means for a port connect to a same pair of differential lines, wherein the northbound frames and the southbound frames are sent and received over a same pair of differential lines that are bidirectional, whereby northbound and southbound frames are transmitted and received over bidirectional pairs of differential lines.

10. The branching memory subsystem of claim 9 wherein the northbound frames and the southbound frames are transmitted at different times over a same pair of differential lines, whereby frame transmission is half-duplex.

11. The branching memory subsystem of claim 9 further comprising:

echo cancellation means for canceling echo when simultaneously transmitting a northbound frame and receiving a southbound frame over the same pair of differential lines, whereby echo cancellation is used for full-duplex transmission of frames.

12. The branching memory subsystem of claim 7 wherein the uplink port means, the first branching downlink port means, and the second branching downlink port means each further comprises:
a plurality of differential driver means for driving data in parallel over pairs of differential lines in parallel;
a plurality of differential receiver means for receiving differential data from pairs of differential lines in parallel;
register means for re-timing received data to a clock,
whereby differential data is transmitted and received in parallel lanes.

13. The branching memory subsystem of claim 12 further comprising:
a plurality of branching memory-bus modules that includes the branching memory-bus device, the plurality of branching memory-bus modules including a first branching memory-bus module, the first branching memory-bus module connected to the host memory controller by a memory channel at the uplink port means of the first branching memory-bus module;
a second branching memory-bus module in the plurality of branching memory-bus modules;
a third branching memory-bus module in the plurality of branching memory-bus modules;
first branch link means for connecting the second branching memory-bus module to the first branching memory-bus module, the first branch link means for connecting the uplink port means of the second branching memory-bus module to the first branching downlink port means of the first branching memory-bus module; and
second branch link means for connecting the third branching memory-bus module to the first branching memory-bus module, the second branch link means for connecting the uplink port means of the third branching memory-bus module to the second branching downlink port means of the first branching memory-bus module,
whereby the branching memory-bus modules form a tree topology.

14. The branching memory subsystem of claim 13 wherein the buffer device means comprises an Advanced Memory Buffer (AMB) with one uplink and two downlink ports.

15. A branching advanced memory buffer comprising:
an uplink port for receiving southbound frames generated by a host processor, the southbound frames containing commands and write data, and for transmitting northbound frames containing read data that was read from memory chips in response to commands in a southbound frame that was earlier transmitted by the host processor;
a first downlink port for re-transmitting southbound frames received by the uplink port, the southbound frames being retransmitted to downstream memory modules on a first branch, the first downlink port also receiving northbound frames from the first branch that are re-transmitted toward the host processor by the uplink port;
a second downlink port for re-transmitting southbound frames received by the uplink port, the southbound frames being retransmitted to downstream memory modules on a second branch, the second downlink port also receiving northbound frames from the second branch that are re-transmitted toward the host processor by the uplink port;
a southbound re-timer, coupled between the uplink port and the first and second downlink ports, for re-timing received data in southbound frames to a clock;
a northbound re-timer, coupled between the first and second downlink ports and the uplink port, for re-timing received data in northbound frames to a clock; and
a selector, coupled to the northbound re-timer, for selecting northbound frames from the first downlink port and from the second downlink port for retransmission over the uplink port,
wherein southbound frames are replicated to the first and second downlink ports.

16. The branching advanced memory buffer of claim 15 further comprising:
elastic buffers, coupled to the selector, for buffering northbound frames for synchronization;
wherein northbound frames from the first downlink port and from the second downlink port are synchronized to generate northbound frames sent out the uplink port,
whereby northbound frames are synchronized.

17. The branching advanced memory buffer of claim 15 wherein the uplink port, the first downlink port, and the second downlink port each comprises:
a differential driver for driving data onto a first pair of differential lines;
a differential receiver for reading differential data sent over a second pair of differential lines;
whereby the northbound and southbound frames are sent over separate pairs of differential lines.

18. The branching advanced memory buffer of claim 15 wherein the uplink port, the first downlink port, and the second downlink port each comprises:
a differential driver for driving data onto a shared pair of differential lines;
a differential receiver for reading differential data sent over the shared pair of differential lines;
whereby the northbound and southbound frames are sent over the shared pair of differential lines.

19. The branching advanced memory buffer of claim 15 wherein the uplink port, the first downlink port, and the second downlink port each comprises:
a plurality of differential drivers for driving data onto a plurality of shared pairs of differential lines;
a plurality of differential receivers for reading differential data sent over the plurality of shared pairs of differential lines;
wherein the northbound and southbound frames are sent as parallel differential data over the plurality of shared pairs of differential lines at different times in a half-duplex mode.

20. The branching advanced memory buffer of claim 15 further comprising:
a third downlink port for re-transmitting southbound frames received by the uplink port, the southbound frames being retransmitted to downstream memory modules on a third branch, the third downlink port also receiving northbound frames from the third branch that are re-transmitted toward the host processor by the uplink port;
a fourth downlink port for re-transmitting southbound frames received by the uplink port, the southbound frames being retransmitted to downstream memory modules on a fourth branch, the fourth downlink port also receiving northbound frames from the fourth branch that are re-transmitted toward the host processor by the uplink port;

wherein the southbound re-timer is further coupled between the uplink port and the third and fourth downlink ports, for re-timing received data in southbound frames to the clock; and a northbound re-timer, coupled between the third and fourth downlink ports and the uplink port, for re-timing received data in northbound frames to the clock, wherein southbound frames are replicated to the first, second, third, and fourth downlink ports.

* * * * *